United States Patent

Zhou et al.

(10) Patent No.: US 6,407,408 B1
(45) Date of Patent: Jun. 18, 2002

(54) METHOD FOR PATTERNING DEVICES

(75) Inventors: Theodore Zhou, Princeton, NJ (US); Vladimir Bulovic, Lexington, MA (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 09/802,976

(22) Filed: Mar. 12, 2001

(51) Int. Cl.[7] ............................................. A01L 35/24
(52) U.S. Cl. ............................ 257/40; 257/88; 438/99; 313/504
(58) Field of Search ..................... 257/40, 88; 438/99; 313/500, 504, 505, 506, 509

(56) References Cited

U.S. PATENT DOCUMENTS

| | | |
|---|---|---|
| 5,276,380 A | 1/1994 | Tang |
| 5,294,869 A | 3/1994 | Tang et al. |
| 5,294,870 A | 3/1994 | Tang et al. |
| 5,641,611 A * | 6/1997 | Shieh et al. ................... 438/35 |
| 5,701,055 A | 12/1997 | Nagayama et al. |
| 5,703,436 A | 12/1997 | Forrest et al. |
| 5,707,745 A | 1/1998 | Forrest et al. |
| 5,773,931 A | 6/1998 | Shi et al. |
| 5,776,622 A | 7/1998 | Hung et al. |
| 5,776,623 A | 7/1998 | Hung et al. |
| 6,005,344 A * | 12/1999 | Fleming ...................... 313/498 |
| 6,016,033 A | 1/2000 | Jones et al. |
| 6,013,538 A * | 11/2000 | Burrows et al. ............... 438/22 |
| 6,191,433 B1 * | 2/2001 | Roitman et al. ............... 257/40 |
| 6,290,563 B1 * | 9/2001 | Codama et al. ................ 445/24 |

* cited by examiner

*Primary Examiner*—Sara Crane
(74) *Attorney, Agent, or Firm*—Kenyon & Kenyon

(57) ABSTRACT

An organic light emitting device is provided. The device has a first electrode, an insulating strip disposed over the first electrode, and a bus line disposed on top of the insulating strip, such that the bus line is electrically insulated from the first electrode by the insulating strip. An integrated mask is disposed over the bus line, such that a portion of the bus line remains exposed vis-a-vis the insulating strip and the integrated mask. An organic layer is disposed over the first electrode, such that the organic layer is electrically connected to the first electrode. A second electrode is disposed over the organic layer, such that the second electrode is electrically connected to the organic layer, and such that the second electrode is electrically connected to the exposed portion of the bus line. A method of fabricating the device is also provided, which involves depositing the organic layer and the second electrode through the integrated mask, such that the second electrode is in electrical contact with the bus line.

33 Claims, 5 Drawing Sheets

METHOD FOR PATTERNING DEVICES

This application is related to concurrently filed patent application Ser. No. 09/802,976, filed Mar. 12, 2001, pending, which is incorporated by reference in its entirety.

FIELD OF THE INVENTION

The present invention relates to the field of semiconductor fabrication, and more particularly to an integrated mask and the use of such a mask to fabricate electrodes.

BACKGROUND OF THE INVENTION

Organic light emitting devices (OLEDs), which make use of thin films that emit light when excited by electric current, are becoming an increasingly popular technology for applications such as flat panel displays. Popular OLED configurations include double heterostructure, single heterostructure, and single layer, and a wide variety of organic materials, some of which are described in U.S. Pat. No. 5,707,745, which is incorporated herein by reference.

Flat panel displays typically include an array of picture elements, or pixels, deposited and patterned on a substrate. Such a pixel array is typically a matrix of rows and columns. In an OLED display, each OLED pixel includes an organic light emitting diode that is situated at the intersection of each column and row line. The first OLED displays, like the first LCD (Liquid Crystal Displays), have typically been addressed as a passive matrix (PM) display. This means that to cause a particular pixel to luminesce, electrical signals are applied to the row and column lines of that particular pixel. The more current that is pumped through each pixel diode, the brighter the pixel appears visually. One method of providing grayscale to the display is to vary the current level of the pixel.

In practice, a voltage is applied to a single row line, and a path for current flow is selectively provided at individual columns. This provides current flow through selected pixels on the single row, thus allowing current to flow causing each pixel in that row line to luminesce at the desired brightness. The next row line is then addressed, and once again, all the pixels on that row line are energized to produce the required brightness. The display continuously scans all the row lines sequentially, typically completing at least 60 scans of the overall display each second. In this way, flicker is not seen since the display is addressed fast enough, for typical observation conditions, that the pixels cannot be seen to be continuously turning on and off. Preferably, the magnitude of current flow through each column can be controlled, such that the brightness of the pixels can be controlled.

For OLEDs from which the light emission is only out of the bottom of the device, that is, only through the substrate side of the device, a transparent anode material such as indium tin oxide (ITO) may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a transparent or bottom-emitting OLED, a top-emitting OLED is one which may have an opaque and/or reflective substrate, such that light is produced only out of the top of the device and not through the substrate.

The transparent cathode that is used in such a transparent or top-emitting device preferably has optical transmission characteristics such that the OLED has an optical transmission of at least about 50%. More preferably, the transparent cathode has optical transmission characteristics that permit the OLED to have an optical transmission of at least about 70%, still more preferably, at least about 85%. These requirements place significant limitations on the materials and thicknesses of the transparent cathode.

The transparent cathodes as disclosed in U.S. Pat. Nos. 5,703,436 and 5,707,745 typically comprise a thin layer of metal such as Mg:Ag with a thickness, for example, that is less than about 100 angstroms. The Mg:Ag layer is coated with a transparent, electrically-conductive, sputter-deposited, ITO layer. Such cathodes may be referred to as compound cathodes or as TOLED ("Transparent-OLED") cathodes. The thickness of the Mg:Ag and ITO layers in such compound cathodes may each be adjusted to produce the desired combination of both high optical transmission and high electrical conductivity, for example, an electrical conductivity as reflected by an overall cathode resistivity of about 30–100$\Omega/\Box$ (ohms per square). However, even though such a relatively low resistivity may be acceptable for certain types of applications, such a resistivity may still be somewhat too high for a passive matrix array of OLED pixels in which the current that powers each pixel needs to be conducted across the entire array through the narrow strips of the compound cathode.

It is known to use bus lines to mitigate limitations on the electrical conductivity of a transparent electrode. In the context of a passive matrix array of OLEDs, the bus line is a thick electrically conductive strip that runs parallel to a transparent electrode, and which provides electrical conductivity in the direction of the electrode. For example, U.S. Pat. No. 6,016,033 to Jones et al. discloses the use of a bus line in an array of OLEDs. Because the bus line is made of a thick electrically conductive material, it does not transmit light, and unfavorably results in an inactive area on the array of OLEDs. Because it is desirable to maximize the active area of an OLED display, it is desirable to minimize the area of the bus line. The active area may be quantified by a "fill-factor," which is the percentage of the area of an array that is active or that emits light. Because of the enhanced electrical conductivity that is provided by a bus line, a bus line may be used notwithstanding the disadvantageous inactive area.

The organic materials of an OLED are very sensitive, and may be damaged by conventional semiconductor processing. For example, any exposure to high temperature or chemical processing may damage the organic layers and adversely affect device reliability. As a result, the processes conventionally used to fabricate a thick metal feature such as a bus line may damage any organic layers that are already present.

One technique that may be used to protect the delicate organic layers of an OLED is an integrated mask through which layers may be selectively deposited during fabrication. The mask is "integrated" because it is left in place after fabrication, thus being integrated into the final device. Using an integrated mask is particularly desirable where the steps used to pattern material or to remove a mask have the potential to damage the device. Even where the integrated mask does not cover the delicate organic layers, the integrated mask protects the delicate organic layers by providing a patterning mechanism that does not require the patterning or removal of a mask once the organic layers are in place, i.e., the potentially damaging processes used to form the integrated mask are performed before the organic layers are present, and the potentially damaging processes used to remove a mask are not performed at all because the integrated mask is left in place. It is known to use an integrated mask to fabricate the top electrodes of an array of OLEDs, as disclosed in U.S. Pat. No. 5,701,055 to Nagayama et. al.

One problem that has been observed with conventional integrated masks is the shorting of adjacent electrode layers across the mask. It is known to use integrated masks having an overhang to mitigate shorting across the mask, as disclosed in U.S. Pat. No. 5,701,055 to Nagayama et. al. However, even with a conventional overhang, the process used to deposit the electrode must meet certain criteria to avoid shorting problems.

First, in order to avoid shorting problems, the "footprint" of the deposited material, defined as the surface area onto which significant material is deposited, should be sharply limited to those surfaces having a direct line of sight, unobstructed by the mask, to the source of material being deposited. The footprint should not extend onto surfaces that do not have a direct line of sight to the source of deposited material. Whether deposition is limited in this way is dependent upon the deposition process. Processes such as low energy deposition of metals by thermal evaporation, generally result in footprint relatively sharply limited to surfaces having a direct line of sight to the source of material. In contrast, processes such as chemical vapor deposition may result in a significantly larger footprint, such that there is significant deposition onto surfaces not having a direct line of sight to the source of material. Processes such as sputter depositing have a footprint between that of thermal evaporation and that of chemical vapor deposition. One mechanism that may lead to a larger footprint is collisions between atoms or molecules of the material being deposited during transit to the substrate, and the resultant scattering. A low "sticking efficiency" of the atoms or molecules being deposited is another such mechanism. These mechanisms may lead to the side walls of a conventional integrated mask being coated with substantial quantities of the material being deposited even though such surfaces may not be within a direct line of sight from the source material.

Second, in order to avoid shorting problems, deposition that is significantly off-axis should be avoided, even for processes that have a limited footprint. Off-axis deposition is deposition from an angle not perpendicular to the substrate. Off-axis deposition may result in surfaces losing their protection from a direct line of sight to the source of material being deposited, such that material may be deposited into the recessed area under an overhang. Moreover, off-axis deposition often involves deposition from a variety of different angles, such that even more surface area loses protection from a direct line of sight during the process. Off-axis deposition may occur for many reasons. For example, the geometry of the substrate, the source, and their relative locations may lead to significant off-axis deposition, and may even lead to significant variations in the angle of deposition at different points on the substrate. The substrate may be placed on a moving conveyor belt during deposition, which inherently leads to off-axis deposition when the substrate is not directly beneath the source of material, and may lead to very large angle off-axis deposition when the substrate is at the edge of the deposition chamber. The substrate may also be rotated during deposition. Even processes that have a somewhat limited footprint, such as sputter depositing, may lead to shorting if there is significant off-axis deposition. It is believed that sputter depositing through a conventional integrated mask leads to shorting when off-axis deposition from angles of about 30 degrees or greater is present, although there may be shorting at smaller angles depending upon the exact process parameters.

It may be desirable, or even necessary in some cases, to use processes having a large footprint, and/or off-axis deposition, to fabricate certain types of layers that are used in an OLED. However, such processes may cause deposition to occur in undesirable regions of the device. For example, an ITO layer typically needs to be deposited using a high energy vacuum sputtering process that produces substantial scattering. Thus, using conventional integrated masks, it may not be possible to fabricate desirable but previously unattainable structures such as transparent or top-emitting OLEDs using a compound Mg:Ag/ITO cathode in a passive matrix OLED array. The use of such a conventional mask may result in the ITO layer causing harmful shorting across adjacent compound cathode strips.

FIG. 1 (prior art) illustrates the type of shorting of an electrode layer that may occur across an integrated mask due to the use of a deposition process that is not perfectly unidirectional. Mask 110 is fabricated on top of substrate 100. A metal layer 120 is deposited over mask 110, with the goal of fabricating electrodes 120a and 120b that are electrically separated. If the vapor deposition process is highly unidirectional, electrodes 120a and 120b, and residual layer 120d, are deposited. Any residual layer 120c that forms would not be continuous or thick enough to have significant electrical conductivity, because the vapor deposition process is highly unidirectional and there is no direct line of sight between the metal deposition source and residual layer 120c. However, if the vapor deposition process produces too much scattering and is, thus, insufficiently unidirectional, residual layer 120c may be continuous and have significant electrical conductivity. In this case, residual layers 120c and 120d may form a short between electrodes 120a and 120b.

It would be desirable to be able to fabricate transparent or top-emitting OLEDs that exploit the high optical transmission of compound cathodes, such as Mg:Ag/ITO, in a passive matrix display, but without having such devices limited by the lower electrical conductivity of such compound cathodes. Furthermore, it would be desirable to be able to vapor deposit electrically conductive materials without encountering the shorting problems that may be experienced whenever such electrically conductive materials undergo substantial scattering during the deposition process.

SUMMARY OF THE INVENTION

In an embodiment of the invention, an organic light emitting device is provided. The device has a first electrode, an insulating strip disposed over a portion of the first electrode, and a bus line disposed on top of the insulating strip, such that the bus line is electrically insulated from the first electrode by the insulating strip. An integrated mask is disposed over the bus line, such that a portion of the bus line remains exposed vis-a-vis the insulating strip and the integrated mask. An organic layer is disposed over the first electrode, such that the organic layer is electrically connected to the first electrode. A second electrode is disposed over the organic layer, such that the second electrode is electrically connected to the organic layer, and such that the second electrode is electrically connected to the exposed portion of the bus line. A method of fabricating the device is also provided, which involves depositing the organic layer and the second electrode through the integrated mask, such that the second electrode is in electrical contact with the bus line.

The bus line may be disposed completely under the recessed area and completely under the overhang on one side of the base such that none of the bus line contributes to a loss in the fill factor of the OLED array. The recessed area on at least one side of the base has an aspect ratio sufficiently large such that no vapor deposition may occur in the furthermost interior, distal, depths of the recessed area even when highly scattered materials are vapor deposited. However, the outermost, proximal, exposed portion of the bus line is sufficiently close to the outermost extension of the overhang so as to allow vapor deposition of a highly scattered second electrode material to make electrical contact with at least a proximal portion of the exposed portion of the bus line.

In an embodiment of the invention, a photoresist mask is provided, having a central region fabricated on an underlying layer. An overhang supported by the central region is separated from the underlying layer by a recessed area. The recessed area has an aspect ratio of at least about 1.5. The mask may be advantageously used to pattern electrodes deposited through the mask by chemical vapor deposition or sputtering, such that there is no significant conductivity across the mask between the patterned electrodes.

DETAILED DESCRIPTION

The present invention will be described with reference to the illustrative embodiments in the following processes and drawing figures.

One embodiment of the present invention provides a photoresist mask having an overhang larger than those available in the prior art. This large overhang enables the use of processes that were not previously available, such as depositing electrodes through an integrated mask using chemical vapor deposition (CVD), or using sputter deposition with significant off-axis deposition. For example, this embodiment may enable the use of sputter deposition where there is off-angle deposition from angles greater than 30 degrees—angles up to 45 degrees, 60 degrees, or even approaching 90 degrees. These electrodes may be transparent if they are made of the appropriate materials, such as indium tin oxide (ITO), MgAg, aluminum, or Al:LiF, fabricated to the appropriate thickness.

The large overhang may also enhance the yield of processes that are presently practiced with conventional masks, and allow such processes to be reliably used with less stringent controls. In addition, even highly directional deposition processes generally have an angle of deposition that varies significantly over a few centimeters. An integrated mask with a large overhang may be used to increase the area over which processes sensitive to angle of deposition is important, such as processes previously practices with shadow masks or integrated masks with smaller overhangs.

Preferably, the mask is monolithic, where monolithic means that the mask is fabricated from a single material, such as photoresist. A monolithic mask avoids disadvantages associated with multi-layer masks, such as additional processing steps.

Another embodiment of the present invention provides a method of using an integrated mask to fabricate a passive matrix array of OLEDs.

Figure 2:
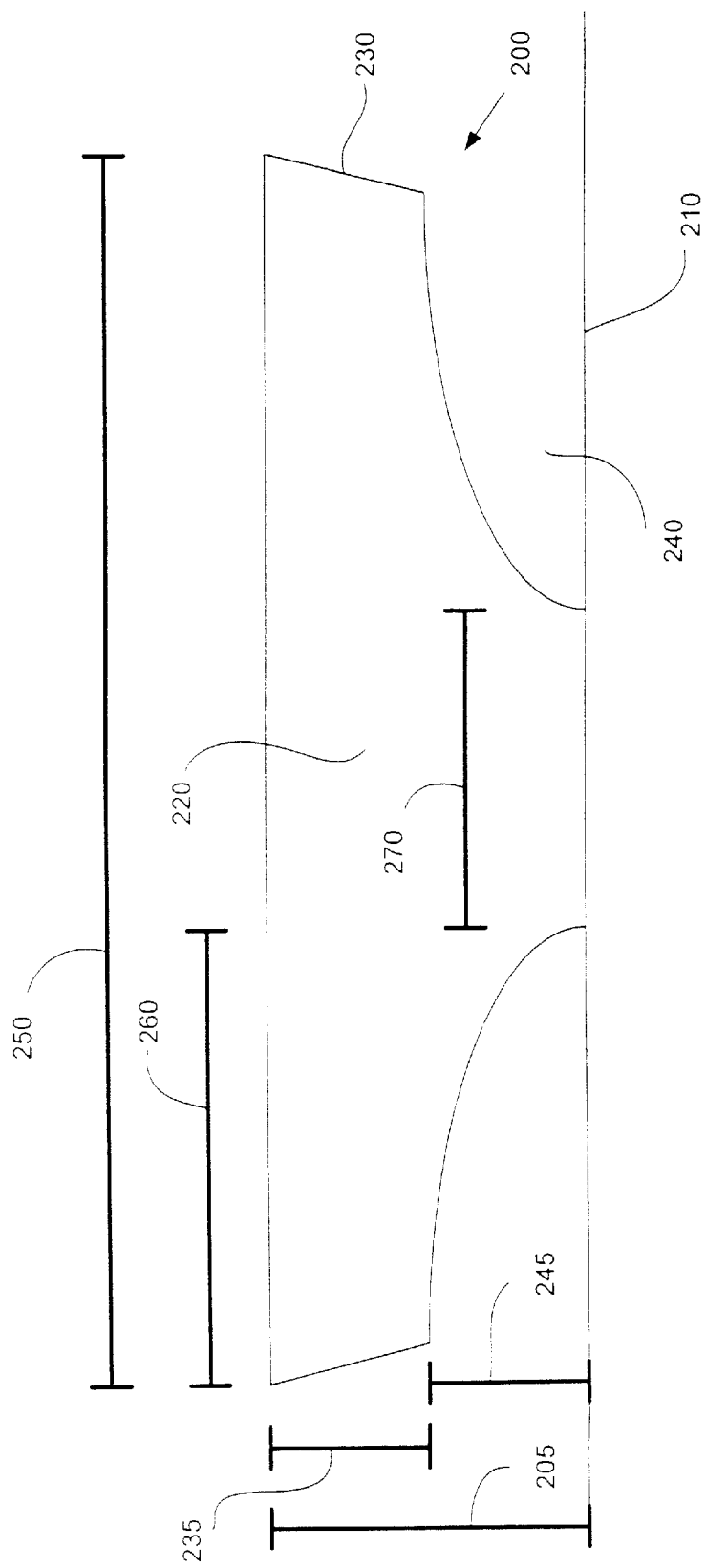
FIG. 2 shows an cross-sectional illustration of a mask in accordance with an embodiment of the invention.

FIG. 2 shows a cross sectional illustration of a mask 200 in accordance with an embodiment of the invention. Mask 200 is disposed on a substrate 210. Mask 200 has a central region 220 and an overhang 230. In central region 220, the mask material is in contact with underlying layers such as substrate 210. The underlying layer may also comprise layers other than the substrate that have been previously fabricated. Overhang 230, by way of contrast, is not in contact with underlying layers. Instead, overhang 230 is separated from underlying layers by a recessed area 240 in which mask material is not present. Mask 200 may be fabricated entirely of a single layer of photoresist, avoiding the additional steps and increased processing expenses associated with masks that include multiple layers of photoresist and/or other materials.

Mask 200 has a total height represented by line 205, and a top width represented by line 250. Central region 220 has a base width represented by line 270. Overhang 230 and recessed area 240 have a depth represented by line 260. At the outer edge of mask 200, overhang 230 has a thickness represented by line 235, and recessed area 240 has a height represented by line 245.

Mask 200 is fabricated with an overhang having dimensions and aspect ratios unprecedented in the prior art. One feature of the invention is the "aspect ratio" of recessed area 240. This aspect ratio is defined as the ratio of depth 260 to height 245. In an embodiment of the invention, the aspect ratio is at least 1.5. More preferably, the aspect ratio is at least 2.0. Most preferably, the aspect ratio is at least 2.2. It is believed that these aspect ratios are sufficiently large to minimize the deposition of electrode material into the depths of recessed area 240 to the point that there is no substantial conductivity across mask 200 due to such electrode material.

In one embodiment of the invention, recessed area 240 preferably has a depth 260 of about 9.5 microns to 13.5 microns, more preferably about 11 to 12 microns, and most preferably about 11.5 microns. Larger depths may result in an overhang that is not rigidly supported, and smaller depths may reduce the functionality of the overhang. The height 245 of recessed area 240 may be about 2 to 6 microns, more preferably about 3 to 5 microns, and most preferably about 4 microns. Lower heights may result in the overhang undesirably touching the substrate at points, or in the overhang coming so close to the substrate that a subsequently deposited layer may undesirably bridge the gap between the overhang and the substrate. Higher heights may reduce the functionality of the overhang by allowing subsequently deposited material to readily enter too deeply into the depths of recessed area 240. However, depending upon the particular process that is used to subsequently deposit material, dimensions outside of these preferred ranges may be used. Central region 120 preferably has a width of about 5–9 microns, more preferably about 6–8 microns, and most preferably about 7 microns. Smaller widths may result in a structurally unstable mask. Larger widths may result in the mask having an undesirably large footprint. However, for applications where mask footprint is not critical, larger widths may be readily used.

Figure 1:
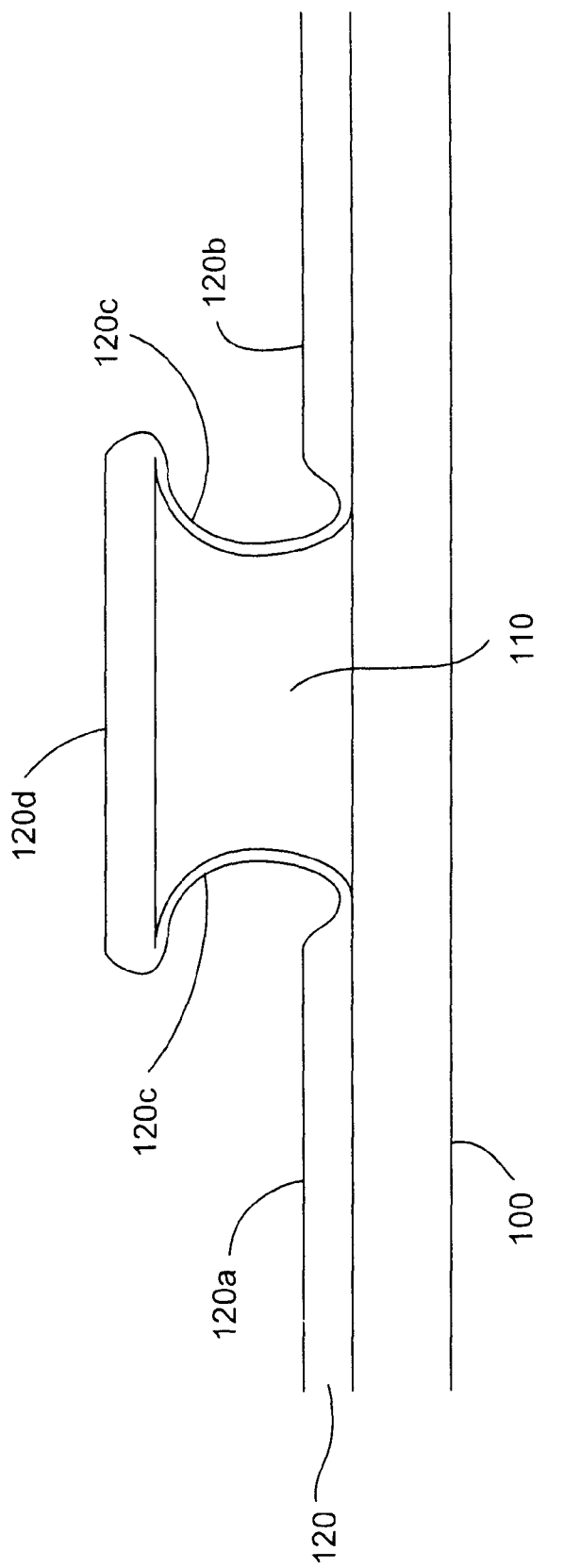
FIG. 1 (prior art) illustrates the shorting of an electrode layer across an integrated mask due to the use of a deposition process that is not perfectly unidirectional.

In one embodiment of the invention, mask 200 does not have a "foot." A foot is a region of the mask near the underlying layer where the central region becomes wider as it nears the underlying layer. For example, FIG. 1 illustrates a mask 110 having a foot. By way of contrast, mask 200 of FIG. 2 does not have a foot, because central region 220 becomes narrower as it nears underlying substrate 210.

In some embodiments of the invention, it is desirable to use planarizing or encapsulation techniques after mask 200 has been used to fabricate a device. Many of the conventional planarizing or encapsulating techniques work best when applied to a device having height variation of less than about 3.0 microns, and more preferably less than about 1.5 microns. It is therefore desirable in some embodiments of the invention to keep the total height 205 less than about 2.5 microns, and more preferably less than about 1.5 microns.

Figure 3:
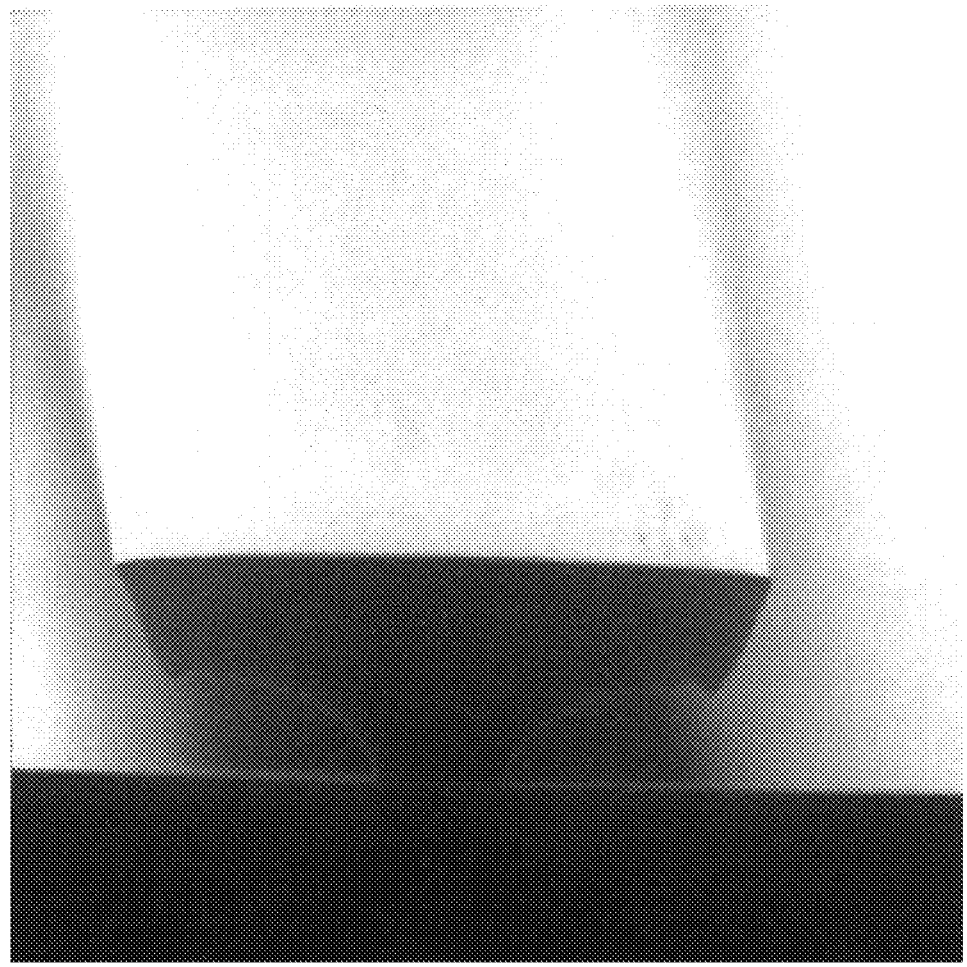
FIG. 3 shows a cross-sectional photograph of an actual mask fabricated in accordance with the present invention, similar to the mask schematically illustrated in FIG. 2.

FIG. 3 shows a cross sectional photograph of an actual mask fabricated in accordance with the present invention, similar to the mask schematically illustrated in FIG. 2.

Figure 4:
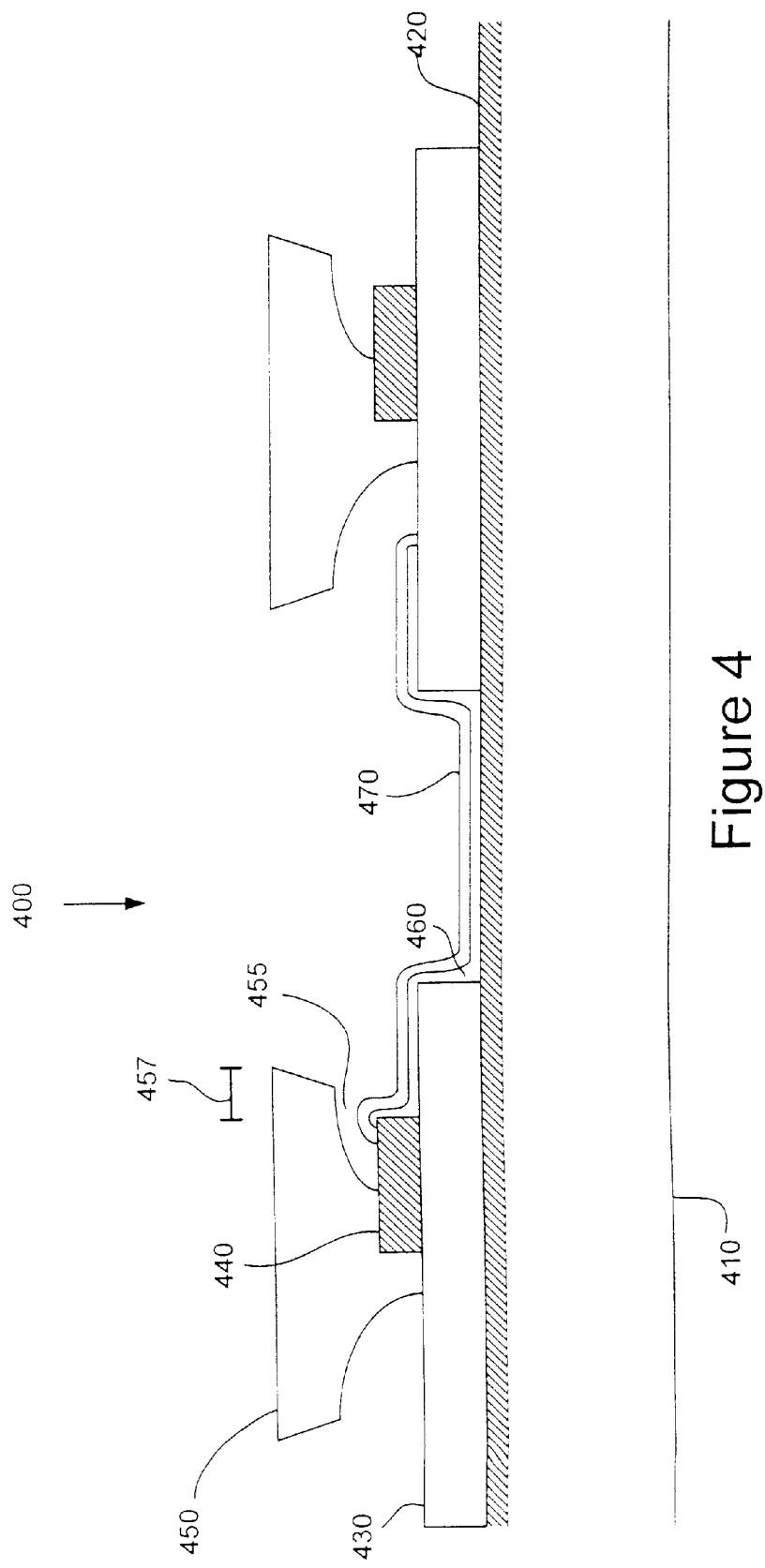
FIG. 4 shows a cross sectional illustration of a device incorporating an integrated mask in accordance with an embodiment of the present invention.

FIG. 4 shows a cross sectional illustration of a device 400 incorporating an integrated mask 450 in accordance with an embodiment of the present invention. Device 400 may be fabricated as follows. A first electrode 420 is deposited and patterned onto a substrate 410 using conventional techniques. First electrode 420 and substrate 410 may be made of conventional materials having conventional dimensions. If device 400 is a top-emitting OLED, first electrode 420 and substrate 410 are preferably selected to maximize back reflection.

An insulating strip 430 is then fabricated using conventional techniques. Insulating strip may be made of any suitable non-electrically conducting material, such as $SiN_x$, $Al_2O_3$, photoresist, or polyimide, and is preferably at least about 1000 Å thick, such that insulating strip electrically reliably insulates first electrode 420 from bus line 440. The width of insulating strip 430 depends upon the type of device manufactured. For a passive matrix display manufactured using presently available equipment, the array may have a pitch of about 50–400 microns. Subsequent technological developments may enable a broader range of pitches. Preferably, the insulating strip has a width that is about 10 to 45 percent of the pitch, and more preferably about 20 to 30 percent of the pitch. A smaller width may not adequately separate adjacent pixels. A larger width may unnecessarily increase the inactive area of the array with a corresponding undesirable decrease in fill-factor. It is desirable to maximize the fill-factor, or the percentage of the area of an emissive array that actually emits light. In the embodiment of FIG. 4, the fill-factor is the percentage of the area not covered by insulating strip 430. In other embodiments, other features may further reduce fill-factor.

A bus line 440 is then fabricated over insulating strip 430 using conventional techniques. Bus line 440 may be made of any suitable metal or other electrically conductive material, such as gold, silver, aluminum or copper, or any suitable alloy. The dimensions of bus line 440 are preferably chosen such that bus line 440 has a resistivity appropriate for the device being fabricated. The appropriate resistivity is generally based on the overall size of the display, and may be readily determined by one of skill in the art. For example, in one embodiment, a resistivity of about 0.3 ohms per square is preferred for a 2 inch square display with 80 dots per inch (dpi). A resistivity that is too large may reduce the usefulness of the bus line, although any resistivity significantly lower than that of second electrode 470 has at least some usefulness. A resistivity that is too small may not result in any additional functionality, and may require an unnecessarily large bus line 440.

A mask 450 is then fabricated over insulating strip 430 and bus line 440, having dimensions consistent with the embodiment of FIG. 2. Mask 450 is fabricated such that a portion of bus line 440 remains exposed vis-a-vis the insulating strip and the integrated mask, so that a subsequently deposited second electrode 470 may be electrically connected to bus line 440. Mask 450 is preferably fabricated such that only one side of bus line 440 is exposed, such that the second electrodes 440 of two adjacent devices 400 separated by mask 450 may not contact the same bus line 440.

One or more organic layers 460 are then deposited through mask 450, such that organic layers 460 are electrically connected to first electrode 420. Two layers can be "electrically connected" without being in physical contact. For example, an intermediate layer, such as an injection enhancement layer, may be present between an electrode and an organic layer that are electrically connected. Organic layers 460 may include any conventional OLED organic materials. Organic layers 460 may be a single layer, or may include the multiple layers of conventional OLED structures, such as a single or double heterostructure, or one or more layers containing a mixture of OLED organic materials.

A second electrode 470 is then deposited through mask 450 and over organic layers 460, such that second electrode 450 is electrically connected to organic layers 460. The dimensions of mask 450 allow second electrode 470 to be fabricated without bridging across mask 450, using processes that would lead to bridging across a conventional mask. Second electrode 470 may be, for example, a sputter deposited electrode made of ITO, aluminum, or LiF:Al. These materials and other may be advantageously used to fabricate a very thin second electrode 470 which is transparent, such that light emitted from organic layer 460 may pass through second electrode 470 to a viewer, in which case device 400 would be a top-emitting OLED.

Note that residual organic and metal layers (not shown) are deposited on top of mask 450 during the deposition of organic layers 460 and second electrode 470, respectively.

Organic layers 460 and second electrode 470 are deposited such that second electrode 470 makes electrical contact with bus line 440, without significant interference from organic layers 460. In order to achieve this electrical contact, second electrode 470 should extend past organic layers 460 onto bus line 440. This extension may occur because second electrode 470 is deposited using a technique that is less unidirectional than that used to deposit organic layers 460. Various process parameters, such as angle of deposition, may also be controlled to ensure that second electrode 470 makes electrical contact with bus line 440.

Depositing bus line 440 over insulating strip 430 advantageously avoids the creation of any additional inactive area on substrate 410. Using the device configuration shown in FIGS. 4 and 5, it is expected that a "fill-factor" or active area of at least 70% should be possible.

Mask 450 is preferably deposited over bus line 440 such that one side of bus line 440 is completely covered by mask 450. This complete coverage on one side prevents a second electrode from an adjacent device from contacting bus line 440.

In one embodiment of the invention, the top width of mask 450 is preferably about 100 microns, and the width of insulating strip 430 is preferably about 150 microns. Preferably, the ratio of the width of insulating strip 430 to the top width of mask 450 is about 1.5:1. Preferably, the width of bus line 440 is about 30–40 microns. Preferably, the outermost exposed edge of bus line 440 is within about 10 microns of the edge of recess 455, i.e., preferably the distance represented by line 457 is about +10 microns to about −10 microns. If bus line 440 does not extend past recess 455, and is too far within recess 455, it may be difficult to achieve good electrical contact between bus line 440 and second electrode 470. It is understood that the invention is not limited to these specific dimensions.

Device 400 emits light when a current is passed between first electrode 420 and second electrode 470, through organic layer 460. Second electrode 470 is electrically connected to bus line 440, and current may reach second electrode 470 through bus line 440, in addition to running along the length of second electrode 470.

Although FIG. 4 shows only a single device 400, the invention may be used with multiple devices 400.

Figure 5:
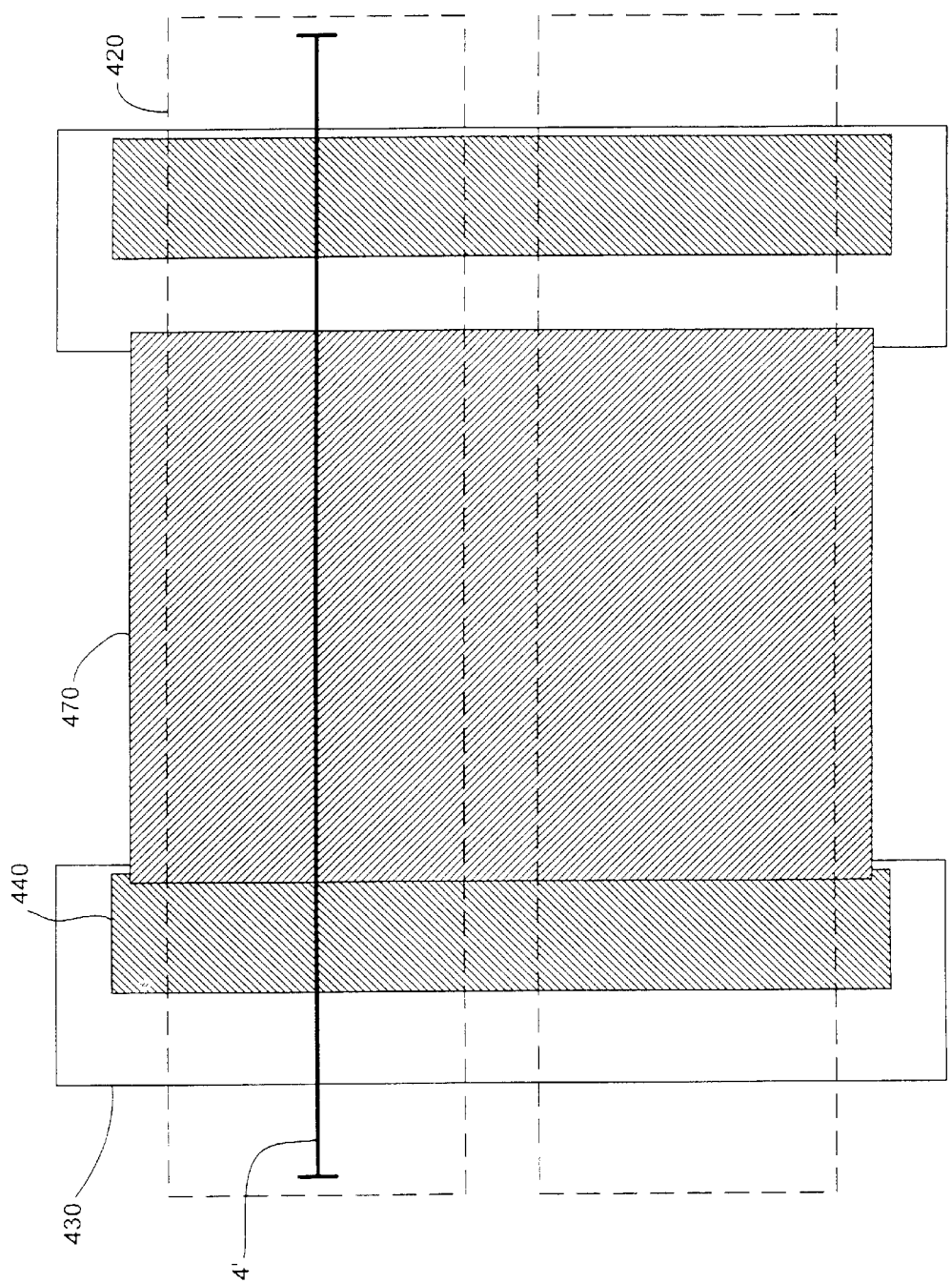
FIG. 5 shows the device of FIG. 4 from a top view.

FIG. 5 shows the device of FIG. 4 from a top view. FIG. 4 is a cross section of FIG. 5 across line 4'. Mask 450 is not shown. Bus line 440 is disposed on top of insulating strip 430, such that there is no electrical contact between bus line 440 and underlying first electrode 420. Bus line 440 allows current to pass readily in the direction of second electrode 470, effectively lowering the resistance of second electrode 470.

The embodiment of FIGS. 4 and 5 is primarily intended for use as a top-emitting OLED, such that light is emitted through second electrode 470. However, the embodiment may also be used as a regular bottom-emitting OLED, such that light is emitted through first electrode 420 and substrate 410.

It is to be understood that the present invention may be used to fabricate much larger arrays of organic devices than those specifically described herein. Although FIG. 5 shows a 1×2 array of devices, much larger arrays may be fabricated. Moreover, a multi-color display may be fabricated by depositing various down-conversion layers known to the art, or using different organic materials in different devices. For example, down-conversion layers may be patterned such that three adjacent individual devices 400—one with no down conversion layer that emits blue, one with a blue-to-green down conversion layer that emits green, and one with a blue-to-red down conversion layer that emits red—form a single multi-color pixel. An array of these multi-color pixels may be fabricated to form a multi-color display. A multi-color array may also be fabricated by a number of other methods, such as using an array of white-emitting OLEDs in combination with color filters or a distributed Bragg reflector.

It is also to be understood that the present invention is not limited to the specific passive-matrix embodiment illustrated in FIGS. 4 and 5, and may be used to in a wide variety of other embodiments. For example, the present invention may be used to fabricate an active matrix display. Each device in an active matrix array generally has one electrode that is individually controlled for that device using a transistor. The other electrode is generally shared with all of the devices in the array. In one embodiment of the present invention, an integrated mask having the novel dimensions disclosed herein may be used to enable the fabrication of an active matrix display having, for example, a common second electrode. Such an array would be similar in appearance to the embodiment of FIGS. 4 and 5, but the first electrode of each device (pixel) in the array would be individually controlled by thin film transistors embedded in the substrate. These first electrodes would not be connected in rows or columns as they are in a passive matrix display. All of the devices in the array would share a common second electrode, similar in appearance to that of FIGS. 4 and 5. Although the integrated mask may locally separate the second electrode into strips, these strips could be electrically connected to each other at the periphery of the array. This approach advantageously allows the second electrode to benefit from the bus lines embedded in the integrated mask, while avoiding the problems associated with fabricating a bus line after the delicate organic layer is present.

The present invention may be used to fabricate a number of consumer products, including flat panel displays, photodetectors, and arrays of photodiodes.

EXAMPLES

Photoresist masks having an overhang consistent with the present invention were fabricated using the following technique.

NR7-6000-PY photoresist was obtained from Futurexx, located in Franklin, N.J. Although the exact formulation of this photoresist is not known to the inventors, it was developed at their request and is presently commercially available. NR7-6000-PY is a negative photoresist, because patterning the photoresist involves selective exposure to ultraviolet radiation, and the subsequent removal of the unexposed portions. The use of a negative resist is preferred for integrated masks, because negative resists can be extensively baked to minimize subsequent outgassing. Such outgassing may damage the organic layers of an OLED, or other sensitive device features, thereby undesirably reducing the lifetime of the OLED.

The photoresist was spin deposited at 2000 RPM for about 40 seconds. The photoresist was then baked at 120° C. for 5 minutes. Next, the photoresist was exposed to ultraviolet radiation from a high pressure mercury lamp operated at a power of 13.5 mW/cm$^2$, for 150 seconds through a mask, such that only the portions of the photoresist that were to remain after developing were exposed. Then, the photoresist was baked at 100° C. for 5 minutes. The photoresist was then developed in RD6, a developer commercially available from Futurexx.

The resultant mask had an appearance similar to that of the mask illustrated in FIG. 2 and photographed in FIG. 3. The total width of the mask, represented by line 250 in FIG. 2, was approximately the same as the width of photoresist that was exposed to ultraviolet radiation.

While the present invention is described with respect to particular examples and preferred embodiments, it is understood that the present invention is not limited to these examples and embodiments. In particular, the present invention is not limited to OLEDs, and may be applied to a wide variety of electronic devices. In addition, with respect to OLEDs, the present invention is not limited to the particular examples and embodiments described. The present invention as claimed therefore includes variations from the particular examples and preferred embodiments described herein, as will be apparent to one of skill in the art.

What is claimed is:

1. An organic light emitting device, comprising:

(a) a first electrode;

(b) an insulating strip disposed over the first electrode;

(c) a bus line disposed on top of the insulating strip, such that the bus line is electrically insulated from the first electrode by the insulating strip;

(d) an integrated mask disposed over the bus line, such that a portion of the bus line remains exposed vis-a-vis the insulating strip and the integrated mask;

(e) an organic layer disposed over the first electrode, such that the organic layer is electrically connected to the first electrode;

(f) a second electrode disposed over the organic layer, such that the second electrode is electrically connected to the organic layer, and such that the second electrode is electrically connected to the exposed portion of the bus line.

2. The device of claim 1, wherein the first electrode is in the shape of a strip, and the insulating strip is oriented about perpendicular to the first electrode.

3. The device of claim 1, wherein the integrated mask has a recessed area having an aspect ratio of at least about 1.5.

4. The device of claim 3, wherein the integrated mask has a recessed area having an aspect ratio of at least about 2.0.

5. The device of claim 4, wherein the integrated mask has a recessed area having an aspect ratio of at least about 2.2.

6. The device of claim 1, wherein the integrated mask has a recessed area having a depth of about 9.5 to about 13.5 microns.

7. The device of claim 6, wherein the integrated mask has a recessed area having a depth of about 11 to 12 microns.

8. The device of claim 1, wherein the second electrode is a transparent electrode containing electrically conductive oxide.

9. The device of claim 8, wherein the electrically conductive oxide is indium tin oxide.

10. The device of claim 1, wherein the second electrode is a transparent electrode containing metal.

11. The device of claim 10, wherein the metal is aluminum.

12. The device of claim 1, wherein the second electrode is a transparent electrode containing of Al:LiF.

13. The device of claim 1, wherein the device is incorporated into a passive matrix display.

14. The device of claim 1, wherein the device is incorporated into an active matrix display.

15. The device of claim 1, wherein the device is incorporated into a flat panel display.

16. A method of fabricating an organic light emitting device, comprising:

(a) fabricating a first electrode;

(b) fabricating an insulating strip over the first electrode;

(c) fabricating a bus line on top of the insulating strip, such that the bus line is electrically insulated from the first electrode by the insulating strip;

(d) fabricating an integrated mask over the bus line, such that a portion of the bus line remains exposed vis-a-vis the insulating strip and the integrated mask;

(e) depositing an organic layer through the integrated mask, such that the organic layer is electrically connected to the first electrode;

(f) depositing a second electrode through the integrated mask, such that the second electrode is electrically connected to the organic layer, and such that the second electrode is electrically connected to the exposed portion of the bus line along its length.

17. The method of claim 16, wherein the first electrode is in the shape of a strip, and the insulating strip is oriented about perpendicular to the first electrode.

18. The method of claim 16, wherein the integrated mask has a recessed area having an aspect ratio of at least about 1.5.

19. The method of claim 18, wherein the integrated mask has a recessed area having an aspect ratio of at least about 2.0.

20. The method of claim 19, wherein the integrated mask has a recessed area having an aspect ratio of at least about 2.2.

21. The method of claim 16, wherein the integrated mask has a recessed area having a depth of about 9.5 to about 13.5 microns.

22. The method of claim 21, wherein the integrated mask has a recessed area having a depth of about 11 to 12 microns.

23. The method of claim 16, wherein the second electrode is a transparent electrode containing electrically conductive oxide deposited by sputtering or chemical vapor deposition.

24. The method of claim 23, wherein the electrically conductive oxide is indium tin oxide.

25. The method of claim 16, wherein the second electrode is a transparent electrode containing metal deposited by sputtering or chemical vapor deposition.

26. The method of claim 25, wherein the metal is aluminum.

27. The method of claim 16, wherein the method is used to fabricate a passive matrix display.

28. The method of claim 16, wherein the method is used to fabricate an active matrix display.

29. The method of claim 16, wherein the organic layer is deposited from an angle different than that from which the second electrode is deposited.

30. The method of claim 16, wherein the method is used to fabricate a flat panel display.

31. The method of claim 16, wherein the method is used to fabricate a photodiode array.

32. The device of claim 1, wherein the integrated mask is made of photoresist.

33. The device of claim 1, wherein the device is incorporated into a photodiode array.

* * * * *